United States Patent [19]
Kimura et al.

[11] Patent Number: 5,360,784
[45] Date of Patent: Nov. 1, 1994

[54] METHOD FOR MANUFACTURING AN OXIDE SUPERCONDUCTING TAPE

[75] Inventors: Toshio Kimura; Takuo Takeshita; Motokazu Suzuki, all of Saitama, Japan

[73] Assignee: Mitsubishi Materials Corporation, Tokyo, Japan

[21] Appl. No.: 923,241

[22] Filed: Jul. 31, 1992

[30] Foreign Application Priority Data

Aug. 23, 1991 [JP] Japan ................... 3-237376

[51] Int. Cl.$^5$ ............... H01B 13/00; H01B 12/04
[52] U.S. Cl. ................... 505/433; 505/704; 505/742; 427/62; 29/599; 174/125.1
[58] Field of Search ............ 505/1, 704, 742, 740; 427/62, 63; 29/599; 174/125.1

[56] References Cited

U.S. PATENT DOCUMENTS 5,100,865 3/1992 Yamamoto et al. .............. 505/1
5,104,849 4/1992 Furukawa .

FOREIGN PATENT DOCUMENTS 0358779 3/1990 European Pat. Off. .
1183102 7/1989 Japan .

OTHER PUBLICATIONS

Sekine et al., "Comparison of Bi-system 2223 and 2212 thick superconducting tapes: grain alignment, current density, and strain effects", J. Appl. Phys. 70(3) Aug., 1991, pp. 1596–1599.

Enomoto et al, "The high field magnetic dependence of critical current density at 4.2 K for Ag-sheathed $Bi_2Sr_2Ca\ Cu_2O_y$ superconducting tape", Jpn. J. Appl. Phys. 29(3) Mar. 1990, pp. L447–L449.

Suzuki et al, "Preparation of Silver-Sheathed Superconducting Wires based on Bismuth Lead Strontium Calcium Copper Oxide", Adv. Supercond. IV, Proc. Int. Symp. Supercond., 4th, Meeting Date 1991, pp. 569–572 (Abstract).

Patent Abstracts of Japan, vol. 13, No. 468 (E–834) Oct. 1989 & JP-A-11 83 102 (Fujikura) (Same as Item (AL) above).

Cryogenics 1990, vol. 30, May 1990, pp. 430–43-3-Dependence of critical current density on microstructure in Ag sheathed $Ba_2YCu_3O_{6+x}$-K. Osamura, et al.

IEEE Transactions on Magnetics, vol. 27, No. 2, Mar. 1991, pp. 890–893–Bi-based high temperature superconducting tapes by cold rolling method–G. Kozlowski et al.

Superconducting Science and Technology, vol. 2, No. 2, 1989, pp. 111–114–Effect of cold-working on the critical current density of Ag-sheathed $Ba_2YCu_3O_{6+x}$-tapes–K. Osamura, et al.

*Primary Examiner*—Roy King
*Attorney, Agent, or Firm*—McAulay Fisher Nissen Goldberg & Kiel

[57] ABSTRACT

An oxide superconducting material is coated with silver or an alloy thereof and shaped into a linear body, and the linear body is subjected to diameter reduction by means of groove roll rolling, a swaging machine and the like, and then differential speed rolling and heat treatment are repeatedly performed, whereby the linear body is shaped into a tape-shaped wire material. The microstructure control in the longitudinal direction is performed uniformly and efficiently, and a superconducting wire having a high c-axis orientation ratio and a large critical current density Jc at a service temperature is obtained.

5 Claims, 3 Drawing Sheets

METHOD FOR MANUFACTURING AN OXIDE SUPERCONDUCTING TAPE

BACKGROUND OF THE INVENTION

The present invention relates to a method for manufacturing an oxide superconducting wire in which an oxide superconducting material is coated with silver or an alloy thereof to provide a linear body which is shaped into a tape-shaped wire material. In particular, it relates to a manufacturing method of a superconducting wire having a large critical current density Jc at a service temperature.

A known manufacturing method for such wires is the silver sheath method in which oxides and carbonate salts of starting materials are mixed in a predetermined composition ratio, and repeatedly calcined and ground. The thus treated material is introduced into a silver pipe or tube which is subjected to diameter reduction by means of cold processing, such as, swaging, roll die rolling, groove roll rolling, die drawing and the like. An ordinary rolling is then carried out with a pair of equal speed rolls or a press to control the microstructure, followed by heat treatment (Kozo Osamura and Sang-Soo Oh: Journal of the Japan Society of Powder and Powder Metallurgy, Vol. 38 (1991, 2) 97–102).

In the linear body produced by this silver sheath method, the silver as the outer coat undergoes a plastic deformation, whereas the oxide layer, i.e., the ceramics, which is the core material, does not undergo such plastic deformation. The ceramic has a density which is much lower than that of the silver. This makes it very difficult to uniformly control of the microstructure of the core material after the diameter reduction of the linear body in the longitudinal direction.

For example, when the linear body is subjected to diameter reduction followed by ordinary rolling, i.e., with rolls of equal circumferential speed, to give a tape-shaped wire material, a waving phenomenon occurs in the interior of the body, as shown in FIG. 3, and the thickness of the oxide layer tends to become extremely heterogeneous. As a result, the structure constituting the oxide layer suffers a three-dimensional deformation to form localized voids and the c-axis thereof does not give orientation perpendicular to the tape surface. As is known, "c-axis" is the vertically oriented crystal axis and shows a line normal to the rolled face along which the superconducting current flows. This is a problem since the critical current density Jc cannot be increased.

When the tape-shaped wire material is produced by means of a press instead of the ordinary rolling procedure, these problems are solved. The pressing treatment is not continuous since only a finite area of the tube can be pressed at a given time. The tube must then be moved and the next successive area pressed. However, the linear body must be moved for each press treatment, lowering the productivity. Also, the oxide layer tends to become heterogeneous at the boundary region between each successive press treatment. This causes the problem that a high critical current density (Jc) cannot be obtained when the wire material becomes longer.

SUMMARY OF THE INVENTION

It is an object of the present invention to provide a method for manufacturing an inventive superconducting wire having a high c-axis orientation ratio and a large critical current density (Jc) at a service temperature and wherein the microstructure in the longitudinal direction is controlled uniformly and efficiently.

This is achieved by coating an oxide superconducting material with silver or an alloy thereof, forming the coated oxide into a linear body, reducing the diameter of the linear body, forming the reduced diameter body into the shape of a tape by passing it through at least one sequence of pressing between rolls having different circumferential speeds followed by heat treatment. The thus formed tape may be subjected to additional sequence of pressing and heating as needed to achieve the desired properties.

DESCRIPTION OF THE PREFERRED EMBODIMENT

Oxide superconducting materials for use with the present invention include superconducting powders, such as, the Bi type, Y type, Tl type, and the like. Specific examples include $Bi_2Sr_2Ca_2Cu_3O_{10+x}$ (hereinafter referred to as the Bi2223 type), $Bi_2Sr_2CaCu_2O_{8+x}$, $YBa_2Cu_3O_{7-x}$, $YBa_2Cu_4O_{7-x}$, $Tl_2Ba_{1.6}Sr_{0.4}Ca_2Cu_3O_x$ and the like. Among them, the Bi2223 type is preferred because it has a high superconducting conversion temperature Tc and is more readily available for practical use. These powders are produced by mixing oxides and carbonates, such as, $Bi_2O_3$, $Y_2O_3$, $BaCO_3$, $SrCO_3$, $Tl_2O_3$, $CaCO_3$, CuO and the like in a predetermined composition ratio, and calcining and grinding the mixture repeatedly. As the coating material for the superconducting material includes silver or an alloy thereof which has properties of oxidation resistance, nonreactivity with the superconducting material, oxygen permeability, low electric resistance and the like.

Manufacturing methods for the linear body include: a method in which the above-mentioned superconducting material is charged into a silver pipe in a form of powder or after pellet formation from the powder; and a method in which a strip of silver is curved in the shape of a gutter, while the superconducting powder or the superconducting pellet is simultaneously uniformly arranged therein. The powder or pellet is then enclosed within the strip. The thus formed linear body is then subjected to diameter reduction by a cool processing method, such as, swaging, roll die rolling, groove roll rolling, die drawing and the like. One or more of these processing methods may be used, depending on the diameter of the linear body and the tape width to be finally produced.

The characteristic constitution of the present invention lies in that the step of heat treatment after performing the differential speed rolling of the linear body subjected to diameter reduction to have a predetermined diameter is repeated.

The shaping of the linear body into a tape is carried out by passing the body between the opposing rollers having different circumferential speeds. The differential speeds may be produced by using rolls of the same outer diameter and different rotational speeds, or rollers having different outer diameters in which the rotational speeds are the same. The present invention may adopt any differential speed rolling.

Figure 2:
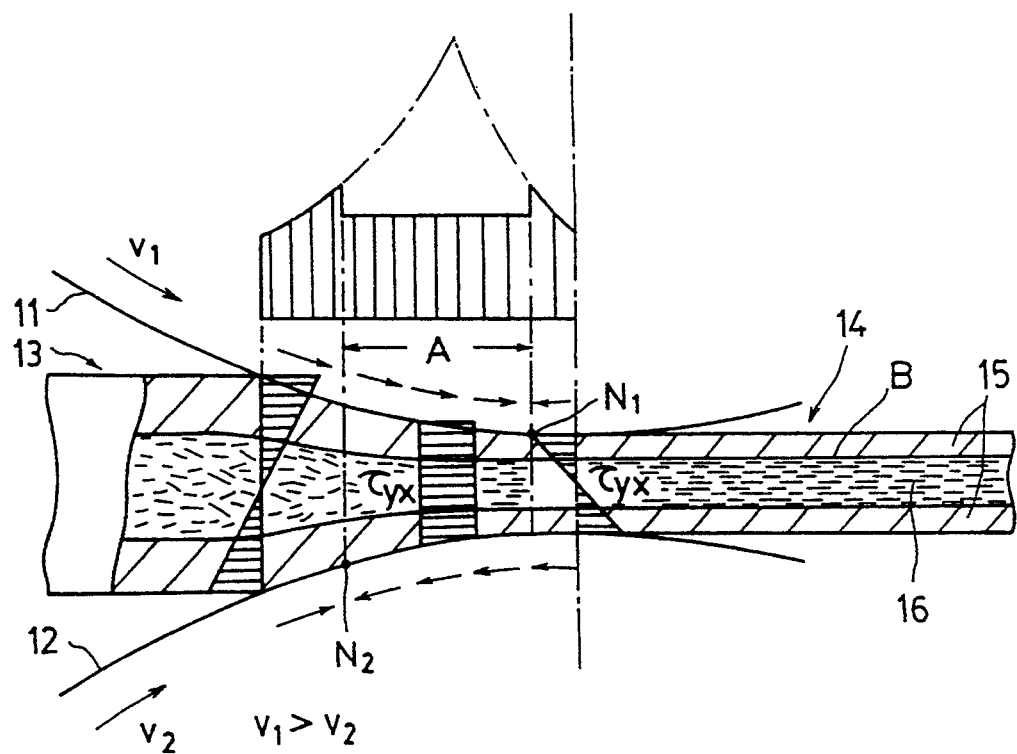
FIG. 2 is a view of a stress state in the gap in the differential speed rolling according to the present invention.
Figure 3:
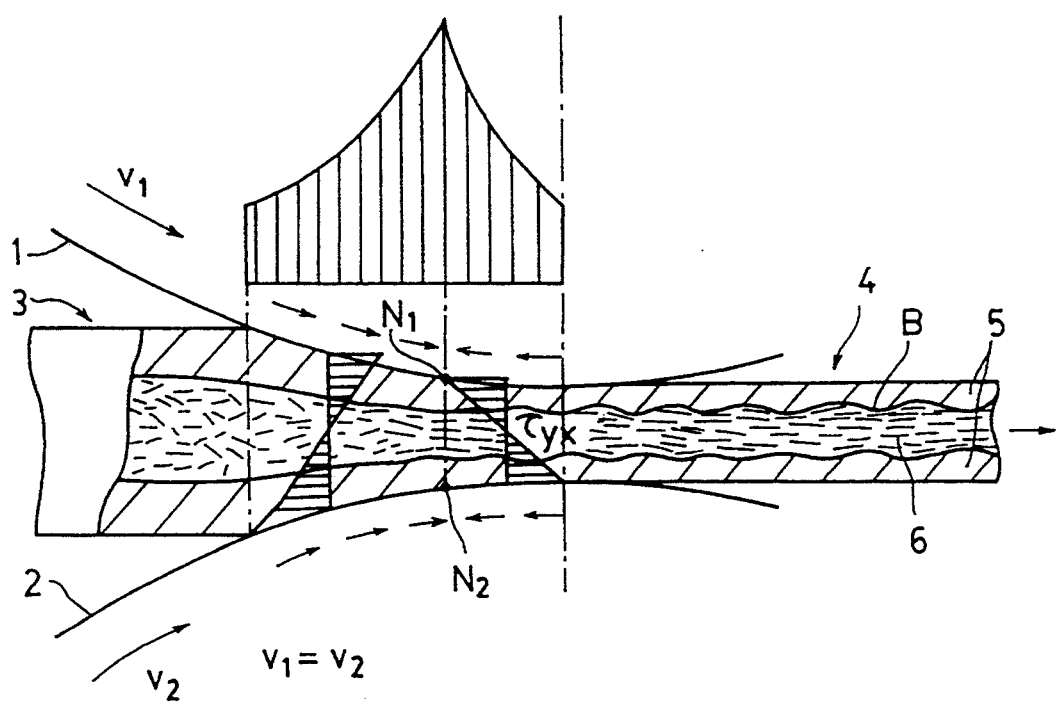
FIG. 3 is a view of a stress state in the gap in the ordinary rolling of a conventional example.

As shown in FIG. 2, in the differential speed rolling of the invention, a high speed roll 11 and a low speed roll 12 having different circumferential speeds relative to each other are used to roll the linear body 13 into the tape-shaped wire material 14. 15 is a silver sheath and 16 is an oxide layer. FIG. 3 shows the position of the neutral points $N_1$ and $N_2$ at which points the speeds of the rolls 1 and 2 and the linear body 3 coincide in the ordinary rolling procedure where the circumferential roll speeds are the same. In contrast, in the differential speed rolling of the invention, the position of the neutral point $N_1$ at which the speed of the high speed roll 11 is the same as that of the linear body 13 exists toward the side of outlet of the roller, i.e., toward the point that the tape exits the rollers. The position of neutral point $N_2$ at which the speed of the low speed roll 12 is the same as that of the linear body 13 is at the inlet side of the rollers. In FIG. 3, 4 is the tape-shaped linear material, 5 is the silver sheath and 6 is the oxide layer.

In the differential speed rolling according to the present invention, wherein that the circumferential speed of the high speed roll 11 is $v_1$ and the circumferential speed of the low speed roll 12 is $v_2$, it is preferable that the differential speed ratio ($v_1/v_2$) is in the range from 1.1 to 3.0. If the differential speed ratio is less than 1.1, it is difficult for the shearing deformation as described hereinafter to occur uniformly. If the differential speed ratio exceeds 3.0, the surface of the tape is considerably deteriorated.

The differential speed rolling serves to orient the crystal grains of the superconducting material. The thus produced tape is subjected to heat treatment to allow the grain growth to further increase the c-axis orientation ratio. The heat treatment conditions vary depending on the particular superconducting materials being treated. For example, with the Bi2223 type, the heat treatment is conducted at 600° to 845° C. in atmospheric air for about 40 to 60 hours. If it is less than 600° C., the c-axis orientation ratio is not high, and if it exceeds 845° C., undesired crystal grains give large grain growth, in both of which a high Jc cannot be obtained.

The linear body is shaped into the tape-shaped wire material by means of the differential speed rolling and the heat treatment. However, the crystal grains of the superconducting material may not have sufficient orientation with respect to the c-axis with a single sequence of the differential speed rolling and the heat treatment in some cases, so that the differential speed rolling and the heat treatment may be repeated. Thus, it is preferably that the number of repetition is about two in order to prevent the decrease in the productivity and the orientation ratio due to excess rolling.

As shown in FIG. 2, in a region A interposed by the both neutral points $N_1$ and $N_2$ in the differential speed rolling machine, the direction of friction becomes inverse at each surface of the rolls 11 and 12. As a result, the linear body 13 undergoes uniform shearing deformation, referred to as cross shear deformation in the thickness direction. As shown in FIG. 3, the shearing stress $\tau_{xy}$ in the ordinary rolling procedure is equal to the friction stress on the contact surface and is zero at the thickness center. In contrast, in the cross shear region A of the differential speed rolling shown in FIG. 2, the shearing stress $\tau_{xy}$ acts uniformly in the thickness direction.

As a result, linear body 13 is rolled in the width direction only, the waving phenomenon at the boundary B due to different densities in the interior of the linear body 13 is prevented, and the c-axis orientation ratio and the density of the oxide layer are increased.

According to the present invention, the linear body undergoes uniform hearing deformation in the cross shear region during the differential speed rolling, so that the waving phenomenon in the interior of the linear body does not take place as it does in the conventional ordinary rolling. With the present invention, it is thus possible to increase the c-axis orientation ratio and the density of the oxide layer of the Bi type, Y type, Tl type and the like.

In addition, the passing of the linear body through the differential speed rolling machine is continuous, so that the intermittent processing with the conventional press operation and its disadvantages are avoids, i.e., the productivity is high and no heterogeneous oxide layer is formed at the boundary between the sequential press areas.

As a result, control of the microstructure in the longitudinal direction can be carried out uniformly and efficiently, and the superconducting wire having a large critical current density Jc at a given service temperature is obtained.

The following examples illustrate but do not limit the present invention.

EXAMPLE

Figure 1:
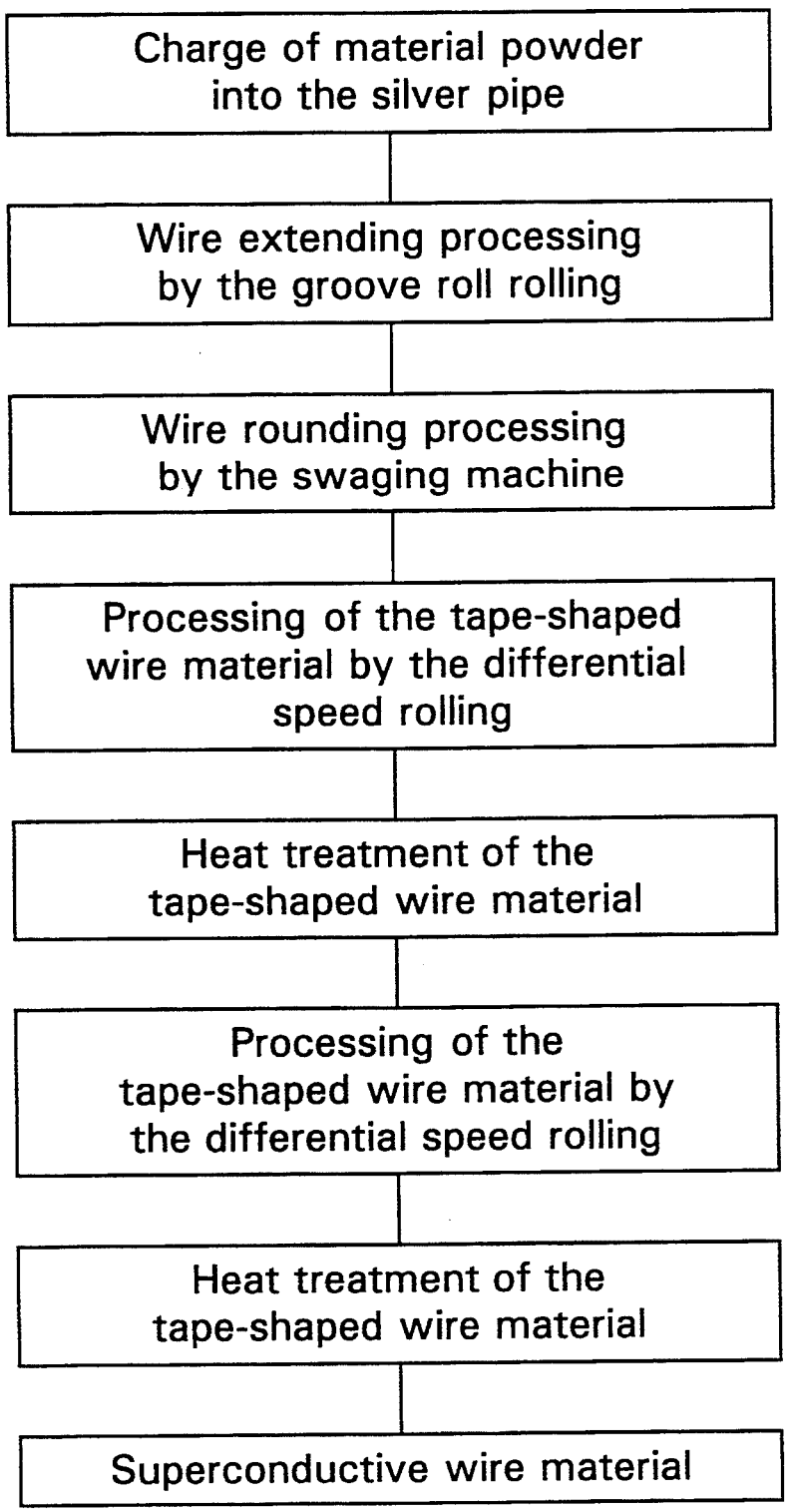
FIG. 1 is a chart of the manufacturing steps for a superconducting wire in accordance with the invention.

As shown in FIG. 1, in accordance with the powder-in-tube method, material powder was charged into an silver pipe. As the material powder, solid phase reaction powder of the Bi2223 type was used. This reaction powder was prepared by weighing powders of $Bi_2O_3$, PbO, $SrCO_3$, $CaCO_3$, and CuO separately to give a composition ratio as shown in Table 1 and mixing the weighed powders followed by repeated calcining and grinding (three times). A silver pipe, having an inner diameter of 5.0 mm, an outer diameter of 6.4 mm and a length of about 500 mm, was used. The above-mentioned solid phase reaction powder was charged into the interior of this pipe to give a density of 2.7 g/cm³.

TABLE 1

| Material Powder | Composition Ratio |
| --- | --- |
| Bi | 1.85 |
| Pb | 0.30 |
| Sr | 1.85 |
| Ca | 2.05 |
| Cu | 3.10 |

Next, the above-mentioned linear body was passed through a groove roll rolling machine, so as to lengthen and make its outer diameter 1.4 mm. Wire rounding processing was continuously performed using a swaging machine to provide an outer diameter of 1.0 mm, which simultaneously increased the density of powder in the silver pipe. After the wire rounding processing, the linear body with the reduced diameter reduction was passed through a differential speed rolling machine (FIG. 2) having a differential speed ratio of 1.4 to from into a tape-shaped wire material having a thickness of 0.2 mm and a width of 1.7 mm.

Figure 4:
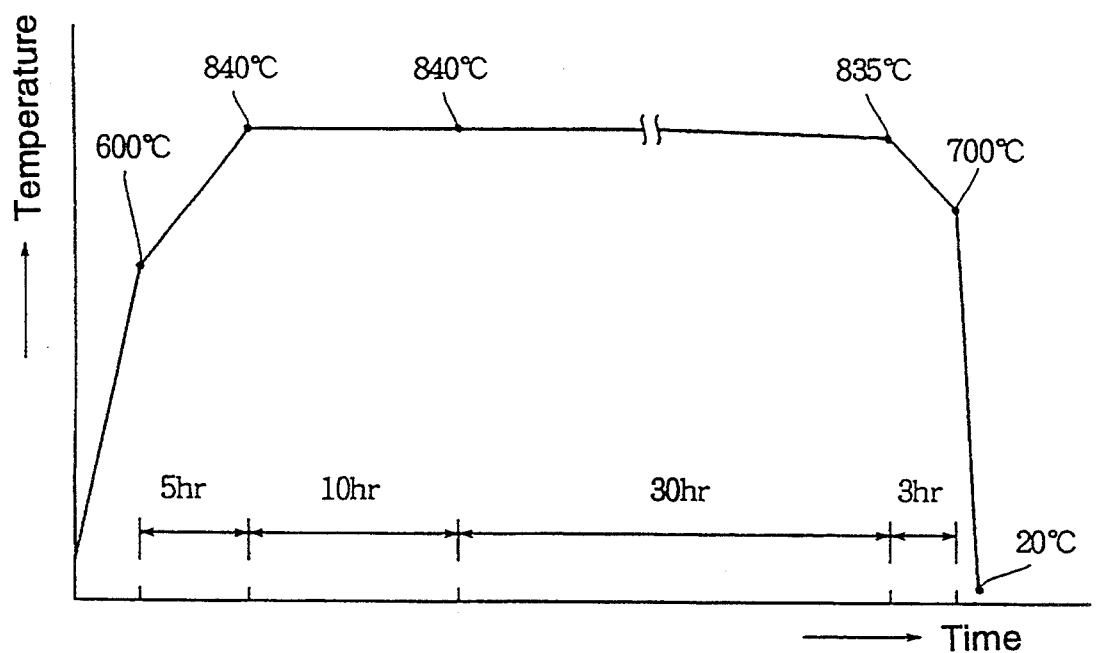
FIG. 4 is a time chart showing a first heat treatment situation of a tape-shaped wire material of the example according to the present invention.

Next, this tape-shaped wire material was introduced into a muffle furnace, and in atmospheric air as shown in FIG. 4, the temperature was raised to 600° C. over 3 hours, the temperature was further raised to 840° C. over 5 hours and maintained at 840° C. for 10 hours. The temperature was lowered to 835° C. over 30 hours, and the temperature was further lowered to 700° C. over 3 hours, and further cooled to 20° C. over 1 hour.

The tape-shaped wire material having been subjected to the heat treatment was again passed through the differential speed rolling machine having a differential speed ratio of 1.4 to process into a tape-shaped wire material having a thickness of 0.14 mm and a width of 2.0 mm, so as to increase the c-axis orientation ratio of the oxide layer. In this case, a core material of the oxide layer had a thickness of 0.07 mm and a width of 1.6 mm.

Figure 5:
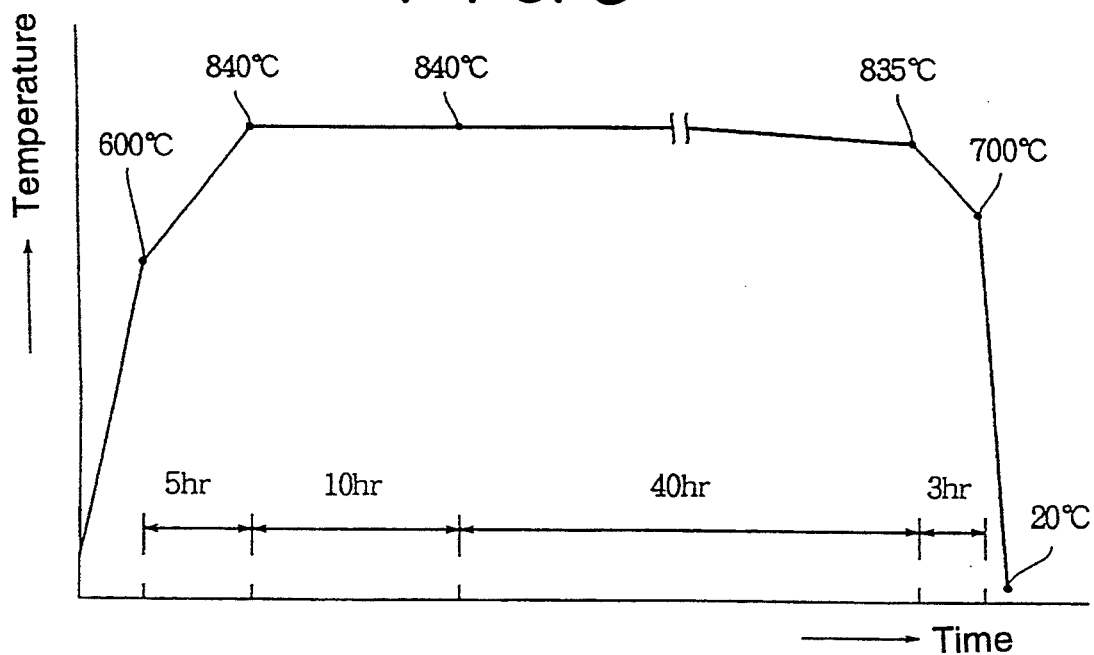
FIG. 5 is a time chart showing a second heat treatment situation of the tape-shaped wire material of the example according to the present invention.

This tape-shaped wire material having been subjected to the rolling processing was again introduced into the muffle furnace, and in atmospheric air as shown in FIG. 5, the temperature was raised to 600° C. over 3 hours, the temperature was further raised to 840° C. over 5 hours and maintained at 840° C. for 10 hours. Then, the temperature was lowered to 835° C. over 40 hours, further lowered to 700° C. over 3 hours, and cooled to 20° C. over 1 hour.

COMPARATIVE EXAMPLE

A tape-shaped wire material was manufactured by means of the same method as the Example except that the ordinary rolling was performed instead of the differential speed rolling.

MEASUREMENT OF SUPERCONDUCTING PROPERTIES AND EVALUATION

Superconducting properties (the critical current Ic and the critical current density Jc) of the tape-shaped wire materials obtained in the Example and Comparative example were measured in liquid nitrogen (77K). In accordance with the direct current 4-terminal method, the current and voltage of the tape-shaped wire materials were measured. In this case, the critical current Ic is expressed as 1 μ V/cm.

The results shown in Table 2 demonstrate the critical current density Jc in the Example was increased by about 38% as compared with the Comparative example.

TABLE 2

|  | Ic (A) | JC (A/cm$^2$) |
|---|---|---|
| Example (differential speed rolling) | 22.5 | 20100 |
| Comparative example (ordinary rolling | 16.3 | 14600 |

We claim:
1. A method for manufacturing a superconducting tape comprising:
   A. charging an oxide superconducting material into a tube made of silver or an alloy thereof to form a linear body;
   B. reducing the diameter of the linear body;
   C. pressing the reduced linear body into a tape by passing it into the nip of opposing rolls having different circumferential speed in which the ratio of the different speeds of the rolls is in the range from about 1.1 to 3.0; and
   D. heat-treating the tape.
2. The method of claim 1 wherein steps C and D are repeated twice.
3. The method of claim 1 wherein the superconducting material is a powder selected from the group consisting of $Bi_2Sr_2Ca_2Cu_3$ oxide, $Bi_2Sr_2CaCu_2$ oxide, $YBa_2Cu_3$ oxide, $YBa_2Cu_4$ oxide, and $Tl_2Ba_{1.6}Sr_{0.4}Ca_2Cu_3$ oxide.
4. The method of claim 1 wherein the superconducting material is $Bi_2Sr_2Ca_2Cu_3$ oxide.
5. The method of claim 1 wherein the temperature of the heat treatment is from about 600° to 845° C.

* * * * *